(12) United States Patent
Omori et al.

(10) Patent No.: US 10,147,534 B2
(45) Date of Patent: Dec. 4, 2018

(54) COMMON MODE NOISE FILTER

(71) Applicant: PANASONIC INTELLECTUAL PROPERTY MANAGEMENT CO., LTD., Osaka (JP)

(72) Inventors: Yoshiharu Omori, Osaka (JP); Takeshi Ichihara, Fukui (JP); Kenji Ueno, Fukui (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/525,491

(22) PCT Filed: Jun. 24, 2015

(86) PCT No.: PCT/JP2015/003162
§ 371 (c)(1),
(2) Date: May 9, 2017

(87) PCT Pub. No.: WO2016/079903
PCT Pub. Date: May 26, 2016

(65) Prior Publication Data
US 2017/0316869 A1  Nov. 2, 2017

(30) Foreign Application Priority Data

Nov. 18, 2014  (JP) .................. 2014-233250

(51) Int. Cl.
*H01F 27/28* (2006.01)
*H01F 5/00* (2006.01)
(Continued)

(52) U.S. Cl.
CPC ..... *H01F 27/2804* (2013.01); *H01F 17/0013* (2013.01); *H03H 1/00* (2013.01);
(Continued)

(58) Field of Classification Search
CPC ................. H01F 27/2804; H01F 27/28; H01F 2027/2809; H01F 5/003; H01F 2005/006;
(Continued)

(56) References Cited

U.S. PATENT DOCUMENTS

2011/0025442 A1* 2/2011 Hsieh .................. H01F 17/0013
336/200
2013/0154786 A1* 6/2013 Nakajima ............... H01F 5/003
336/200
(Continued)

FOREIGN PATENT DOCUMENTS

CN  203931711 U  11/2014
JP  09-270332 A  10/1997
(Continued)

OTHER PUBLICATIONS

Internatoinal Search Report and Written Opinion issued in Internatoinal Patent Application No. PCT/JP2015/003162, dated Sep. 8, 2015; with English translation.

(Continued)

Primary Examiner — Mang Tin Bik Lian
(74) Attorney, Agent, or Firm — McDermott Will & Emery LLP (57) ABSTRACT

A common mode noise filter includes a first coil and a second coil. The first coil is formed in a plurality of insulating layers and includes a spiral first coil conductor and a spiral second coil conductor. The second coil is formed in the plurality of insulating layers and includes a spiral third coil conductor and a spiral fourth coil conductor. The first and third coil conductors are magnetically coupled to form a first common mode filter unit, and the second and fourth coil conductors are magnetically coupled to form a second common mode filter unit. As viewed from above, a first direction in which currents flow through the first and third coil conductors in the first common mode filter unit is (Continued)

opposite to a second direction in which currents flow through the second and fourth coil conductors in the second common mode filter unit.

8 Claims, 9 Drawing Sheets

(51) Int. Cl.
*H03H 1/00* (2006.01)
*H03H 7/42* (2006.01)
*H01F 17/00* (2006.01)

(52) U.S. Cl.
CPC ..... *H03H 7/427* (2013.01); *H01F 2017/0073* (2013.01); *H01F 2017/0093* (2013.01); *H01F 2027/2809* (2013.01); *H03H 2001/0085* (2013.01); *H03H 2001/0092* (2013.01)

(58) Field of Classification Search
CPC ............ H01F 17/0006; H01F 17/0013; H01F 17/0093; H01F 2017/0026; H03H 7/427; H03H 2001/0092; H03H 1/00
USPC ................................. 336/200, 232, 222, 223
See application file for complete search history.

(56) References Cited

U.S. PATENT DOCUMENTS

| | | | | |
|---|---|---|---|---|
| 2014/0191838 A1* | 7/2014 | Yoshida | ............. | H01F 17/0013 336/200 |
| 2014/0292468 A1* | 10/2014 | Motomiya | .......... | H01F 17/0013 336/200 |
| 2014/0306787 A1* | 10/2014 | Kato | ................... | H01F 17/0013 336/105 |

FOREIGN PATENT DOCUMENTS

| | | |
|---|---|---|
| JP | 2002-373810 A | 12/2002 |
| JP | 2010-124270 A | 6/2010 |
| JP | 2013-098279 A | 5/2013 |
| JP | 2014-175825 A | 9/2014 |
| JP | 2015-005628 A | 1/2015 |

OTHER PUBLICATIONS

English Translation of Chinese Search Report dated Feb. 26, 2018 for the related Chinese Patent Application No. 201580061018.5.

* cited by examiner

PRIOR ART

COMMON MODE NOISE FILTER

RELATED APPLICATIONS

This application is the U.S. National Phase under 35 U.S.C. § 371 of International Patent Application No. PCT/JP2015/003162, filed on Jun. 24, 2015, which in turn claims the benefit of Japanese Application No. 2014-233250, filed on Nov. 18, 2014, the disclosures of which Applications are incorporated by reference herein.

TECHNICAL FIELD

The present invention relates to a compact, slim common mode noise filter for use in various electronic devices, including a digital device, an audiovisual device, and an information communication terminal.

BACKGROUND ART

Figure 11:
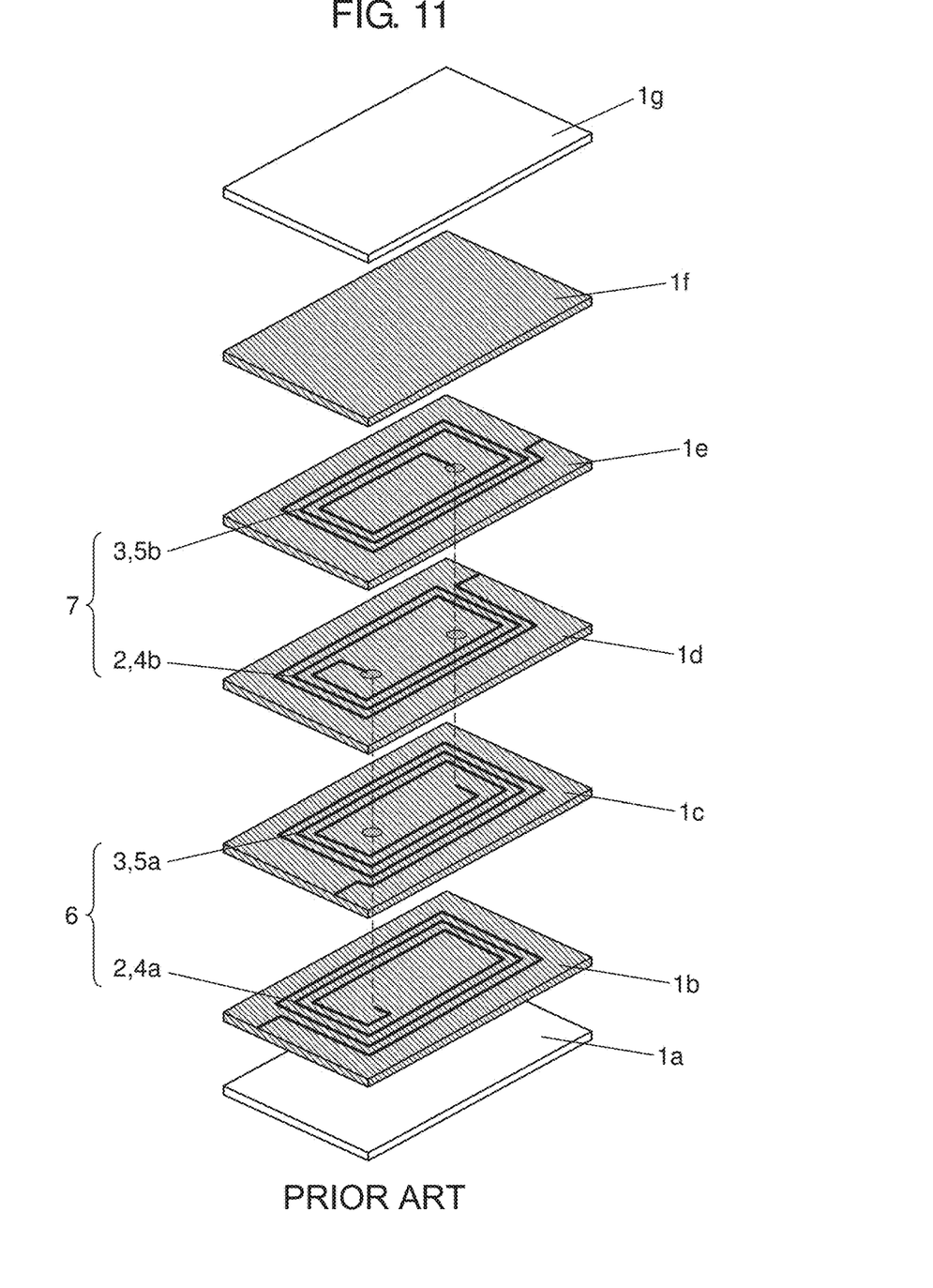
FIG. 11 is an exploded perspective view of a conventional common mode noise filter.

A conventional common mode noise filter will be described with reference to the accompanying drawings. FIG. 11 is an exploded perspective view of a conventional common mode noise filter. As illustrated in FIG. 11, the conventional common mode noise filter includes a plurality of stacked insulating layers 1a to 1g, first coil 2, and second coil 3. First coil 2 is configured by connecting spiral first coil conductor 4a to spiral second coil conductor 4b. Second coil 3 is configured by connecting spiral third coil conductor 5a to spiral fourth coil conductor 5b. The coil conductors (first coil conductor 4a, second coil conductor 4b) that constitute first coil 2 and the coil conductors (third coil conductor 5a, fourth coil conductor 5b) that constitute second coil 3 are alternately disposed. First coil conductor 4a and third coil conductor 5a are magnetically coupled together to form first common mode filter unit 6. Second coil conductor 4b and fourth coil conductor 5b are magnetically coupled together to form second common mode filter unit 7. By connecting first common mode filter unit 6 to second common mode filter unit 7 in series, the conventional common mode noise filter reliably provides a high common mode impedance, removing common mode noise.

For example, PTL 1 is known as a prior art document information regarding the invention of this application.

CITATION LIST

Patent Literature

PTL 1: Unexamined Japanese Patent Publication No. 2002-373810

SUMMARY OF THE INVENTION

According to an aspect of the present invention, a common mode noise filter includes a plurality of insulating layers, a first coil, and a second coil. The plurality of insulating layers are stacked on top of one another. The first coil is formed in the plurality of insulating layers and includes a first coil conductor and a second coil conductor each having a spiral shape. The second coil is formed in the plurality of insulating layers and includes a third coil conductor and a fourth coil conductor each having a spiral shape. An arrangement is made in accordance with (1) or (2), (1) the first to fourth coil conductors are disposed so that the first coil and the second coil are alternately disposed, or (2) the third coil conductor and the fourth coil conductor are disposed so as to be sandwiched between the first coil conductor and the second coil conductor. The first coil conductor and the third coil conductor are magnetically coupled together to form a first common mode filter unit, and the second coil conductor and the fourth coil conductor are magnetically coupled together to form a second common mode filter unit. The first common mode filter unit is connected in series to the second common mode filter unit. A first direction is opposite to a second direction as viewed from above, the first direction being a direction in which currents flow through the first coil conductor and the third coil conductor in the first common mode filter unit, and the second direction being a direction in which currents flow through the second coil conductor and the fourth coil conductor in the second common mode filter unit.

With the above configuration, the common mode noise filter according to an aspect of the present invention can attenuate common mode noise in two frequency bandwidths.

DESCRIPTION OF EMBODIMENTS

Prior to the description of exemplary embodiments of the present invention, there will be described a problem with the conventional common mode noise filter illustrated in FIG. 11 that the inventor(s) has/have found.

Nowadays, a Wi-Fi function is incorporated into not only portable information terminals, but also TV sets and other devices. In order to ensure their receiving sensitivities, the devices use a noise filter that reduces radiation noise from circuits therein. There is a demand for common mode noise filters to exhibit a high common mode noise attenuation in two frequency bandwidths, especially at or near 2.4 GHz and 5.0 GHz, for example.

However, a frequency characteristic of the common mode noise filter illustrated in FIG. 11 is obtained only from a serial connection between first common mode filter unit 6 and second common mode filter unit 7. Therefore, when common mode noise enters the common mode noise filter, only one attenuation pole based on its self-resonance emerges. In this case, the common mode noise filter may be unable to sufficiently attenuate the common mode noise in a frequency bandwidth other than the self-resonance frequency, thereby failing to attenuate the common mode noise in two frequency bandwidths.

A common mode noise filter in this exemplary embodiment can attenuate common mode noise in two frequency bandwidths.

First Exemplary Embodiment

A common mode noise filter according to a first exemplary embodiment of the present invention will be described below with reference to FIGS. 1 to 3.

Figure 1:
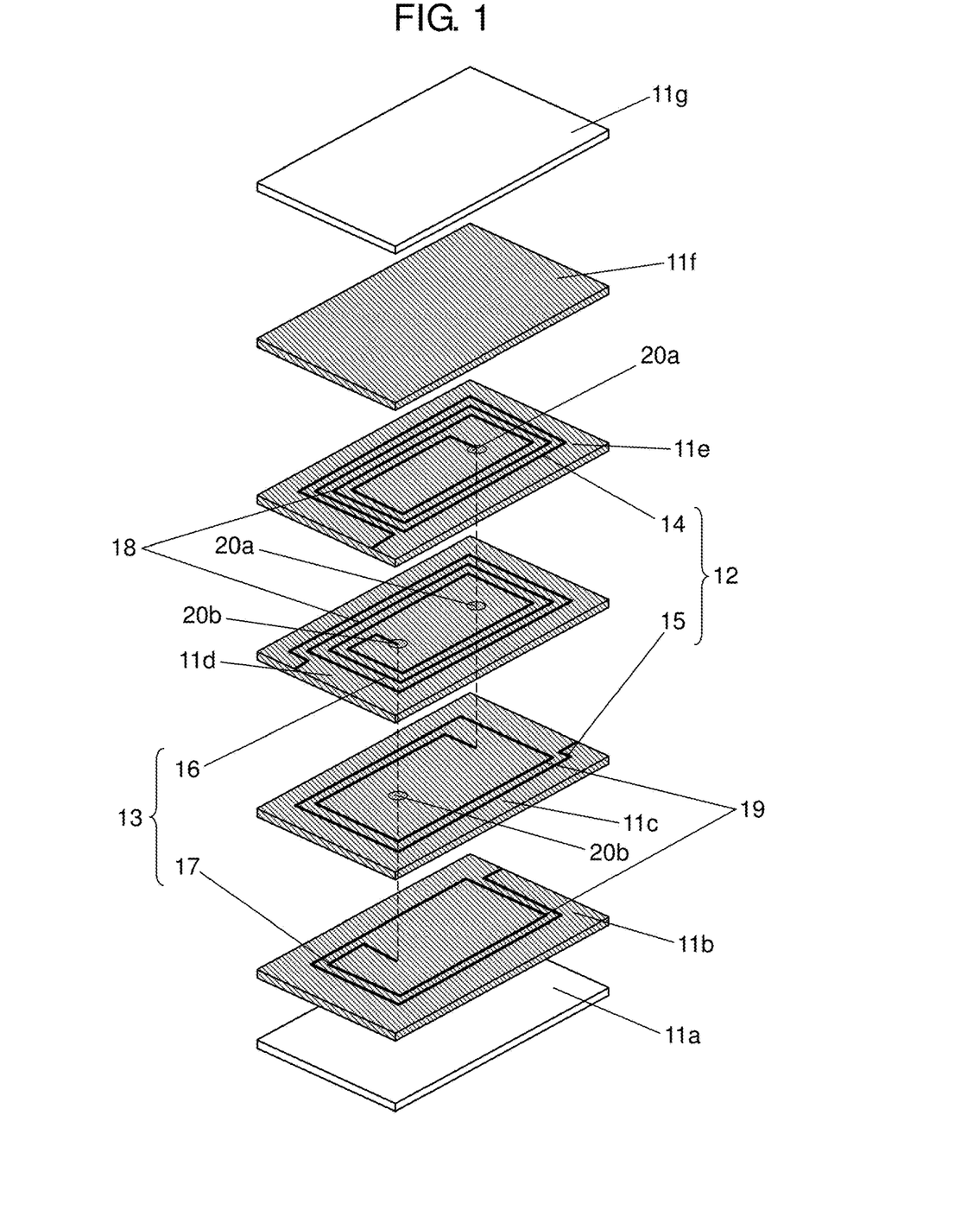
FIG. 1 is an exploded perspective view of a common mode noise filter in a first exemplary embodiment.

FIG. 1 is an exploded perspective view of the common mode noise filter in the first exemplary embodiment of the present invention. FIG. 2 is a perspective view of the common mode noise filter in the first exemplary embodiment of the present invention. FIG. 3 is a schematic circuit diagram of the common mode noise filter in the first exemplary embodiment of the present invention.

In the common mode noise filter in the first exemplary embodiment of the present invention, as illustrated in FIG. 1, insulating layers 11a to 11g are stacked on top of one another in this order from the bottom. The common mode noise filter in this exemplary embodiment includes: a plurality of stacked insulating layers (insulating layers 11a to 11g); and first coil 12 that is formed in the plurality of insulating layers and includes spiral first coil conductor 14 and spiral second coil conductor 15. Furthermore, the common mode noise filter includes second coil 13 that is formed in the plurality of insulating layers and includes spiral third coil conductor 16 and spiral fourth coil conductor 17. First coil conductor 14, second coil conductor 15, third coil conductor 16, and fourth coil conductor 17 are disposed such that first coil 12 and second coil 13 are alternately disposed. More specifically, first coil conductor 14, third coil conductor 16, second coil conductor 15, and fourth coil conductor 17 are disposed side by side in this order from the top.

First coil conductor 14 and third coil conductor 16 are magnetically coupled together to form first common mode filter unit 18. Second coil conductor 15 and fourth coil conductor 17 are magnetically coupled together to form second common mode filter unit 19.

First common mode filter unit 18 is connected in series to second common mode filter unit 19.

As viewed from above, a first direction in which currents flow through first coil conductor 14 and third coil conductor 16 in first common mode filter unit 18 is opposite to a second direction in which currents flow through second coil conductor 15 and fourth coil conductor 17 in second common mode filter unit 19. Details of turn directions of first to fourth coil conductors 14 to 17 will be described later.

In the common mode noise filter in this exemplary embodiment, a number of turns of each of first coil conductor 14 and third coil conductor 16 in first common mode filter unit 18 is different from a number of turns of each of second coil conductor 15 and fourth coil conductor 17 in second common mode filter unit 19.

More specifically, the number of turns of each of first coil conductor 14 and third coil conductor 16 in first common mode filter unit 18 is set to three, whereas the number of turns of each of second coil conductor 15 and fourth coil conductor 17 in second common mode filter unit 19 is set to one. In short, in this exemplary embodiment, the number of turns of each of first coil conductor 14 and third coil conductor 16 in first common mode filter unit 18 is larger than the number of turns of each of second coil conductor 15 and fourth coil conductor 17 in second common mode filter unit 19.

Herein, the expression "the number of turns" means the number of times that a coil conductor completely makes a circuit, and its remaining portion is ignored.

In the above configuration, insulating layers 11a to 11g are stacked on top of one another in this order from the bottom. Each of insulating layers 11b to 11f is made of a material that is not a magnetic substance, more specifically, an insulating, non-magnetic material, such as Cu—Zn ferrite or glass ceramics, and is formed into a sheet shape. Each of insulating layers 11a, 11g is made of an insulating, magnetic material, such as Cu—Ni—Zn ferrite, and is formed into a sheet shape. Alternatively, all of insulating layers 11a to 11g may be made of a non-magnetic material.

First and second coils 12, 13 are formed in the interior of insulating layers 11b to 11f. First coil 12 is configured by spiral first coil conductor 14 and spiral second coil conductor 15. Second coil 13 is configured by spiral third coil conductor 16 and spiral fourth coil conductor 17.

Each of first to fourth coil conductors 14 to 17 is formed by plating or printing a conductive material, such as silver, into a spiral shape.

First coil conductor 14 is formed on an upper surface of insulating layer 11e; second coil conductor 15 is formed on an upper surface of insulating layer 11c; third coil conductor 16 is formed on an upper surface of insulating layer 11d; and fourth coil conductor 17 is formed on an upper surface of insulating layer 11b.

First and second coil conductors 14, 15 that constitute first coil 12 and third and fourth coil conductors 16, 17 that constitute second coil 13 are alternately stacked on top of one another. In this exemplary embodiment, first to fourth coil conductors 14 to 17 are stacked in a vertical direction, thereby achieving a space-saving design. As viewed from above, portions of first coil conductor 14 and third coil conductor 16 are disposed at substantially the same location, and first coil conductor 14 and third coil conductor 16 are magnetically coupled together by feeding currents thereto in the same direction, thereby forming first common mode filter unit 18. Likewise, as viewed from above, portions of second coil conductor 15 and fourth coil conductor 17 are disposed at substantially the same location, and second coil conductor 15 and fourth coil conductor 17 are magnetically coupled together by feeding currents thereto in the same direction, thereby forming second common mode filter unit 19.

In addition to the above, the direction in which the currents flow through first and third coil conductors 14, 16 in first common mode filter unit 18 is opposite to the direction in which the currents flow through second and fourth coil conductors 15, 17 in second common mode filter unit 19. When common mode noise enters the common mode noise filter, if the current flows through first and third coil conductors 14, 16 clockwise as viewed from above in FIG. 1, the current flows through second and fourth coil conductors 15, 17 counterclockwise. As a result, first common mode filter unit 18 and second common mode filter unit 19 do not mutually intensify their magnetic coupling, as opposed to the conventional example. Thus, the common mode noise filter cannot provide a great magnetic coupling on the whole.

In addition to the above, the number of turns of each of first and third coil conductors 14, 16 in first common mode filter unit 18 is larger than the number of turns of each of second and fourth coil conductors 15, 17 in second common mode filter unit 19. The conductors in first to fourth coil conductors 14 to 17 are disposed at substantially the same intervals, and second and fourth coil conductors 15, 17 oppose first and third coil conductors 14, 16 as viewed from above.

The number of turns of each of second and fourth coil conductors 15, 17 is preferably set to ⅓ to ⅔ the number of turns of each of first and third coil conductors 14, 16.

The outermost portions of second and fourth coil conductors 15, 17 may face to the outermost portions of first and third coil conductors 14, 16, in accordance with a characteristic requirement. Alternatively, the innermost portions of second and fourth coil conductors 15, 17 may face to the innermost portions of first and third coil conductors 14, 16.

First coil conductor 14 and second coil conductor 15 are interconnected through first via electrodes 20a formed in insulating layers 11d, 11e, thereby constituting first coil 12. Third coil conductor 16 and fourth coil conductor 17 are interconnected through second via electrodes 20b formed in insulating layers 11c, 11d, thereby constituting second coil 13.

First via electrodes 20a formed in insulating layer 11d and first via electrode 20a formed in insulating layer 11e are provided at the same location as viewed from above. Likewise, second via electrode 20b formed in insulating layer 11c and second via electrode 20b formed in insulating layer 11d are provided at the same location as viewed from above. Each of first via electrodes 20a and second via electrodes 20b is formed by making a through-hole in a corresponding insulating layer at a predetermined location with laser and filling this hole with silver.

In this exemplary embodiment, insulating layers include insulating layers 11a to 11g (seven sheets); however, the number of insulating layers 11a to 11g is not limited to the number illustrated in FIG. 1.

Figure 2:
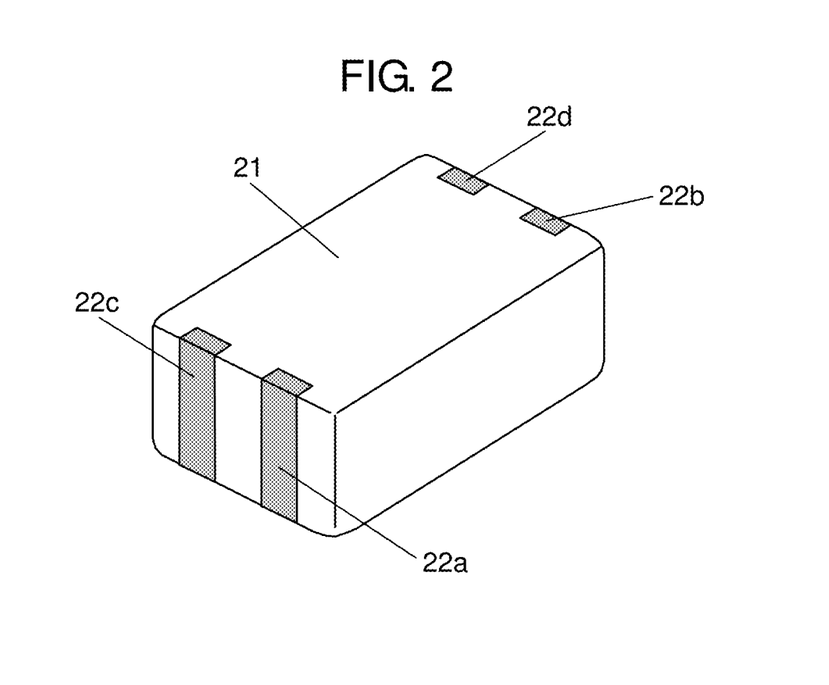
FIG. 2 is a perspective view of the common mode noise filter in the first exemplary embodiment.

In the above configuration, as illustrated in FIG. 2, main body 21 of common mode noise filter is formed. On both surfaces of main body 21, first to fourth external electrodes 22a to 22d are provided. First to fourth external electrodes 22a to 22d are connected, respectively, to first to fourth coil conductors 14 to 17. First to fourth external electrodes 22a to 22d are formed by printing silver on the surfaces of main body 21. Then, nickel plating layers are formed on the surfaces of first to fourth external electrodes 22a to 22d with plating. Thereafter, low-melting-point metal plating layers, such as tin or solder, are formed on the surfaces of nickel plating layers with plating.

As described above, the common mode noise filter in the first exemplary embodiment of the present invention is formed such that the direction in which the currents flow through first and third coil conductors 14, 16 in first common mode filter unit 18 is opposite to the direction in which the currents flow through second and fourth coil conductors 15, 17 in second common mode filter unit 19. As a result, when common mode noise enters the common mode noise filter, the common mode noise filter can ensure common mode noise attenuations in two frequency bandwidths. More preferably, the number of turns of each of first and third coil conductors 14, 16 in first common mode filter unit 18 is different from the number of turns of each of second and fourth coil conductors 15, 17 in second common mode filter unit 19. First common mode filter unit 18 and second common mode filter unit 19 thereby generate different frequency characteristics. Consequently, when common mode noise enters the common mode noise filter, the common mode noise filter can ensure common mode noise attenuations in two frequency bandwidths.

More specifically, first common mode filter unit 18 and second common mode filter unit 19 generate magnetic fluxes in opposite directions. Thus, first common mode filter unit 18 and second common mode filter unit 19 do not mutually intensify their magnetic coupling, as opposed to the conventional example. In this case, first common mode filter unit 18 and second common mode filter unit 19 provide different frequency characteristics. Consequently, the common mode noise filter is effective in providing common mode noise attenuations in two frequency bandwidths.

Next, the common mode attenuation property will be described.

Figure 4:
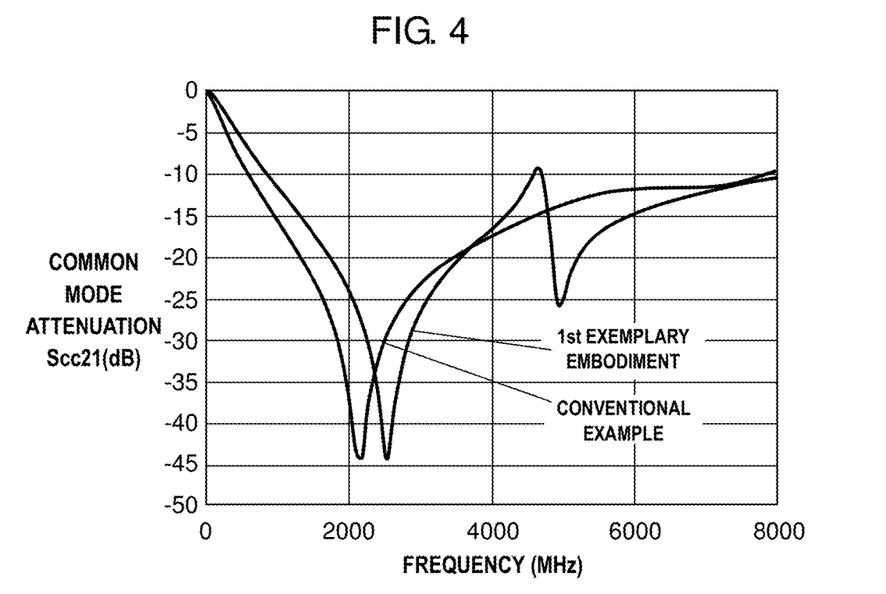
FIG. 4 is a comparative diagram illustrating common mode attenuation properties of the common mode noise filter in the first exemplary embodiment and a conventional common mode noise filter.

FIG. 4 is a comparative diagram illustrating common mode attenuation properties of the common mode noise filter in the first exemplary embodiment of the present invention and a conventional common mode noise filter.

As can be seen from FIG. 4, the conventional common mode noise filter provides an attenuation in only one frequency bandwidth. In contrast, it can be found that the common mode noise filter in the first exemplary embodiment of the present invention provides attenuations in two frequency bandwidths.

As illustrated in FIG. 1, insulating layers 11e, 11f (first insulating layers) are in contact with only one or both of first and third coil conductors 14, 16, among first to fourth coil conductors 14 to 17. Insulating layers 11b, 11c (second insulating layers) are in contact with only one or both of second and fourth coil conductors 15, 17 in second common mode filter unit 19. A dielectric constant of insulating layers 11e, 11f is preferably different from a dielectric constant of insulating layers 11b, 11c. Because of this difference in dielectric constant, first common mode filter unit 18 and second common mode filter unit 19 generate different frequency characteristics, thus making it possible to provide attenuations in two frequency bandwidths. However, insulating layer 11d is an exception, because insulating layer 11d is in contact with both coil conductors, namely, third coil conductor 16 constituting first common mode filter unit 18 and second coil conductor 15 constituting second common mode filter unit 19.

Figure 5:
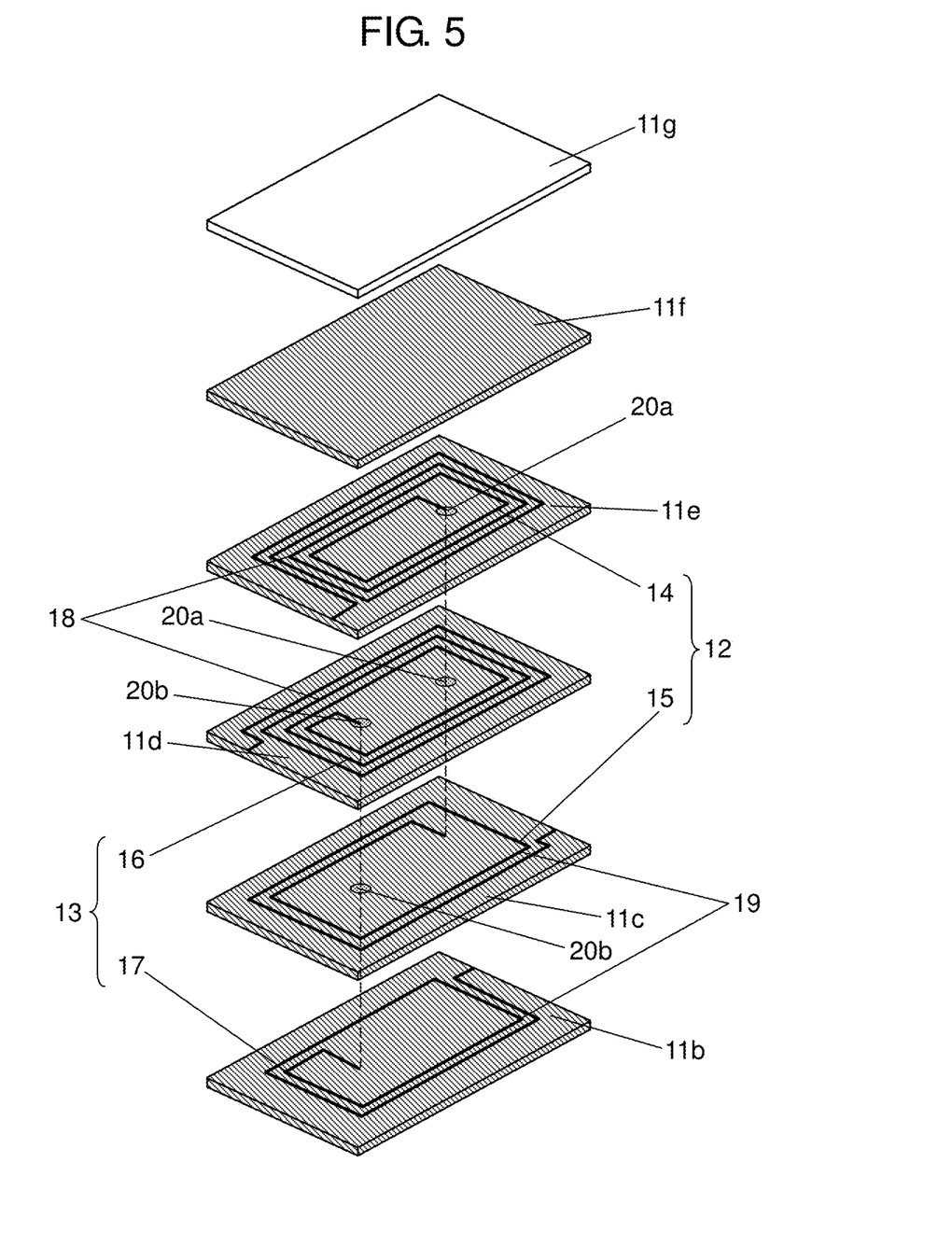
FIG. 5 is an exploded perspective view of a modification of the common mode noise filter in the first exemplary embodiment.

Alternatively, as illustrated in FIG. 5, no magnetic substance (insulating layer 11a) may be formed on an outer side, in the stacked direction, of (or beneath) second and fourth coil conductors 15, 17 in second common mode filter unit 19, whose number of turns is smaller than that of first and third coil conductors 14, 16 in first common mode filter unit 18. In short, magnetic body 11g is formed on only one side of upper and lower sides of the plurality of insulating layers on which coil conductors (first and third coil conductors 14, 16) having a larger number of turns are formed. This configuration can prevent a magnetic substance in second common mode filter unit 19 from causing any magnetic loss and dielectric loss. It is thus possible to prevent a reduction in impedance of second common mode filter unit 19 having a smaller number of turns, at a frequency of an attenuation pole of common mode noise in its frequency characteristic, thereby providing a high common mode attenuation.

Second Exemplary Embodiment

A common mode noise filter according to a second exemplary embodiment of the present invention will be described below with reference to the drawings.

Figure 6:
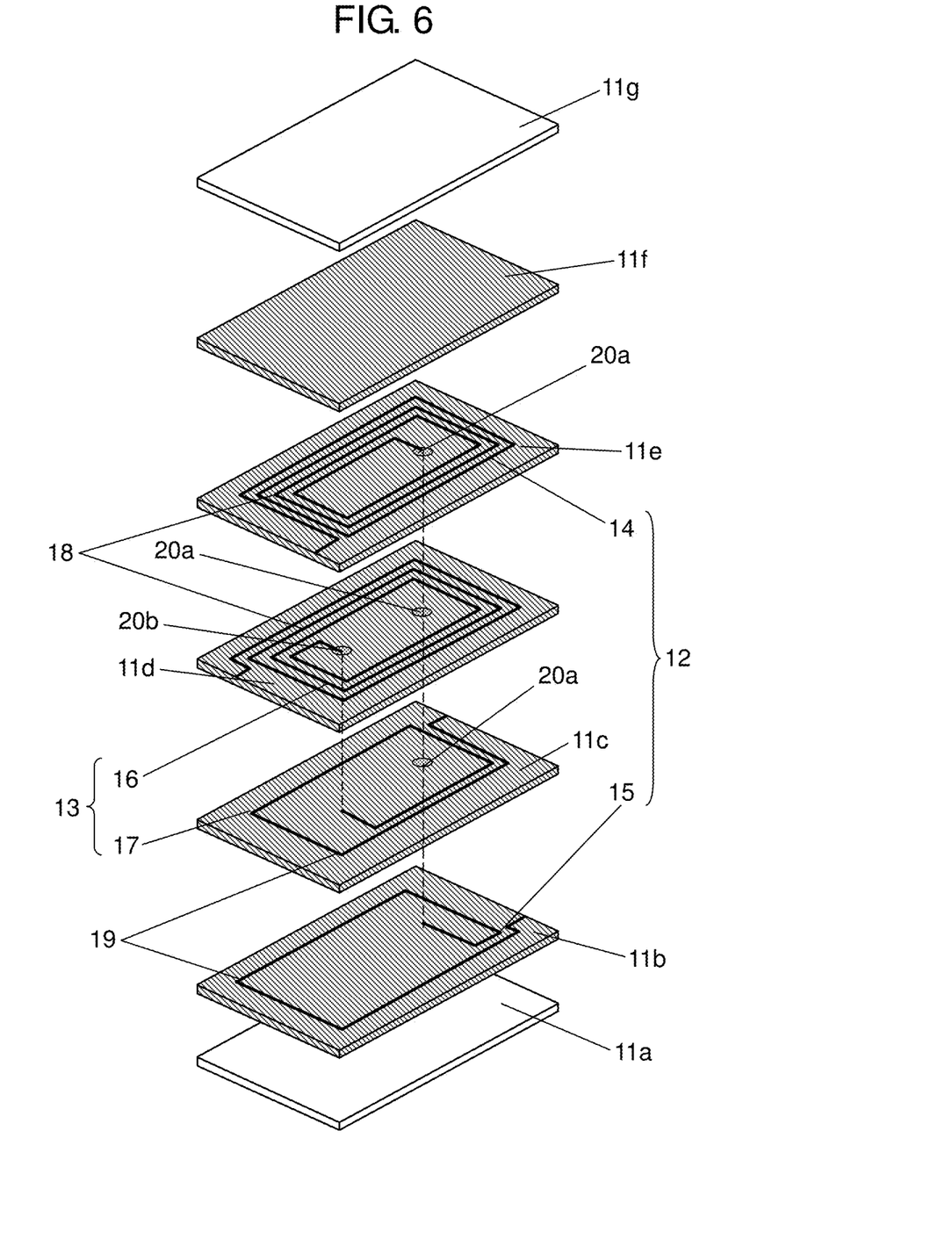
FIG. 6 is an exploded perspective view of a common mode noise filter in a second exemplary embodiment.
Figure 7:
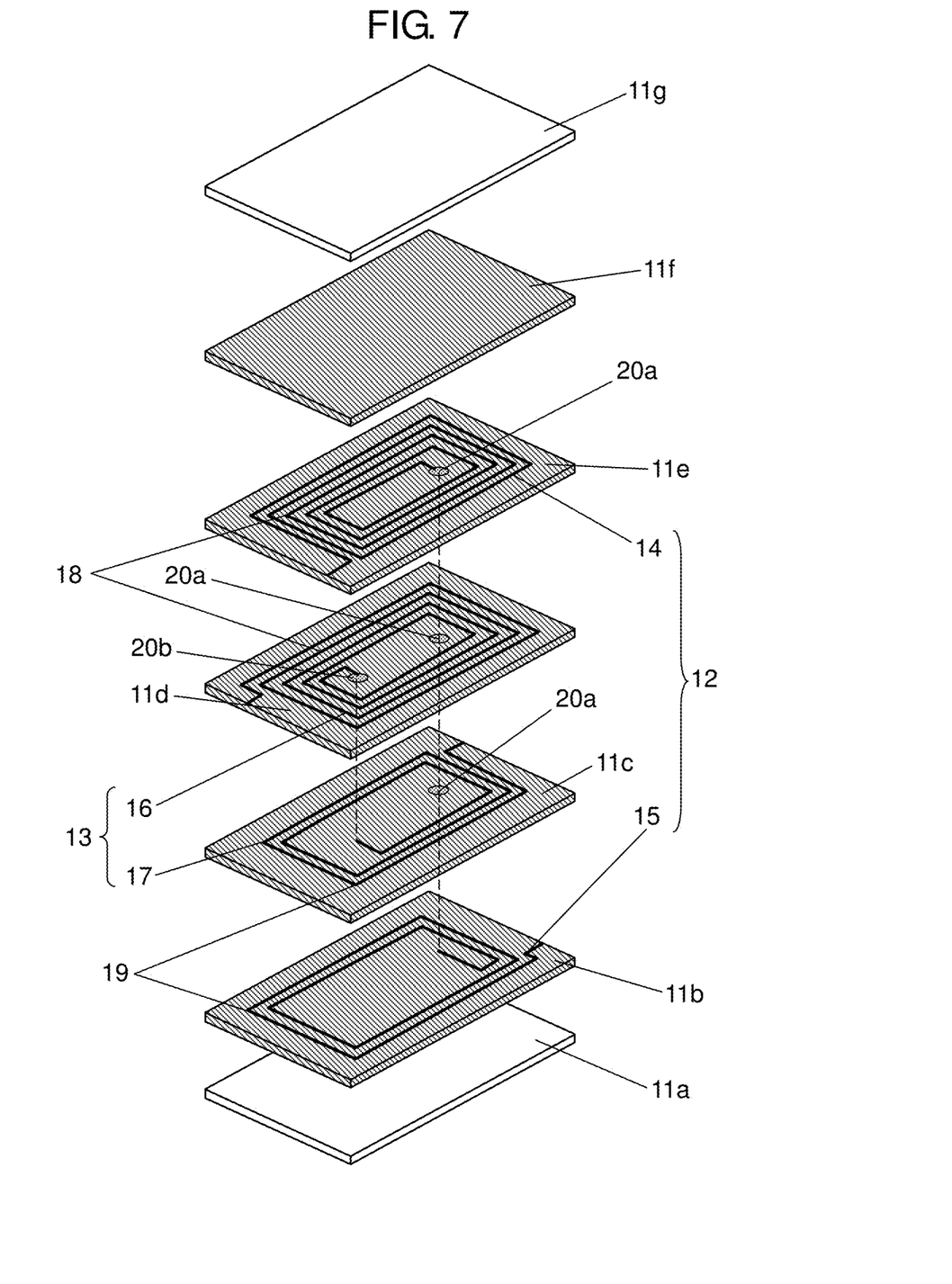
FIG. 7 is an exploded perspective view of a modification of the common mode noise filter in a second exemplary embodiment.

FIGS. 6 and 7 are exploded perspective views of the common mode noise filter in the second exemplary embodiment of the present invention. Components in the second exemplary embodiment of the present invention which are similar to those in the first exemplary embodiment of the present invention are given identical reference characters and will not be described.

As illustrated in FIGS. 6 and 7, the second exemplary embodiment of the present invention is different from the first exemplary embodiment of the present invention in the following point.

The second exemplary embodiment is different from the first exemplary embodiment only in that the order in which second coil conductor 15 and fourth coil conductor 17 are stacked is reversed. Along with reversing the stacking order of second coil conductor 15 and fourth coil conductor 17, a method for routing coil conductors in the second exemplary embodiment is slightly different from that in the first exemplary embodiment.

As illustrated in FIGS. 6 and 7, third coil conductor 16 and fourth coil conductor 17 that constitute second coil 13 are disposed so as to be sandwiched between first coil conductor 14 and second coil conductor 15 that constitute first coil 12.

Figure 3:
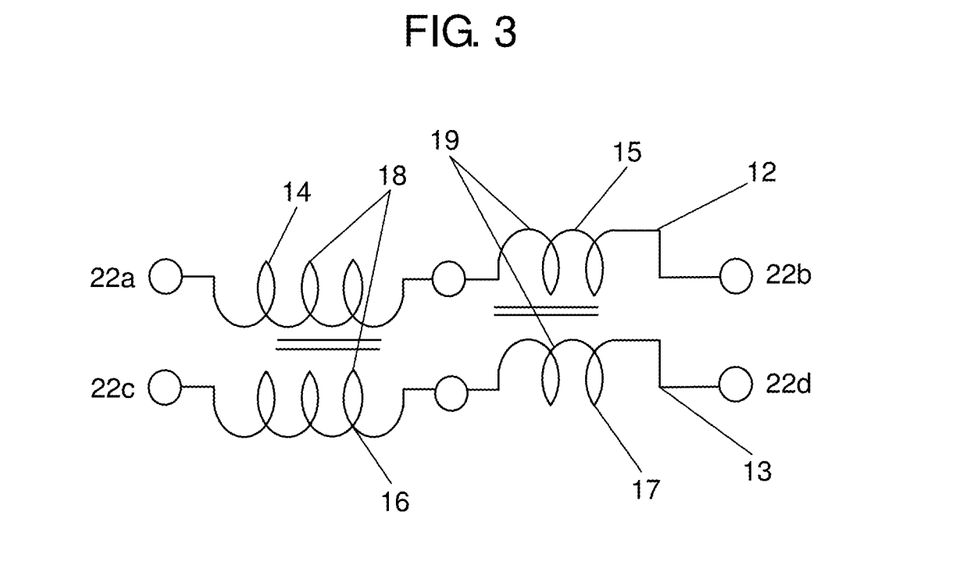
FIG. 3 is a schematic circuit diagram of the common mode noise filter in the first exemplary embodiment.

A schematic circuit diagram of the common mode noise filter in the second exemplary embodiment is similar to that in the first exemplary embodiment of the present invention illustrated in FIG. 3.

In the common mode noise filter configured as above in this second exemplary embodiment, third coil conductor 16 and fourth coil conductor 17 adjacent to each other have the same electric potential, because third coil conductor 16 and fourth coil conductor 17 constitute second coil 13. This configuration decreases stray capacitance between first common mode filter unit 18 and second common mode filter unit 19 (in particular, between third coil conductor 16 constituting first common mode filter unit 18 and fourth coil conductor 17 constituting second common mode filter unit 19). Thus, the configuration can suppress the signals from being degraded by the stray capacitance between first common mode filter unit 18 and second common mode filter unit 19, even when differential signals enter the common mode noise filter. In this way, the common mode noise filter in this exemplary embodiment improves the balance between the differential signals in first common mode filter unit 18 and second common mode filter unit 19. Consequently, the common mode noise filter can provide attenuations in two frequency bandwidths, as well as can decrease a proportion in which an input differential signal component is converted into a common mode, which then is output and prevent loss of the differential signals from being degraded.

In addition to the above, in the first and second exemplary embodiments of the present invention, it is preferable that a total length of coil conductors 14, 15 constituting first coil 12 (a line length of first coil 12) be substantially equal to a total length of coil conductors 16, 17 constituting second coil 13 (a line length of second coil 13). This configuration does not greatly displace the differential balances of amplitude and phase between the signals passing through two coil conductors 14, 15 in first coil 12 and between the signals passing through two coil conductors 16, 17 in second coil 13 from ideal states, even when differential signals enter common mode noise filter. Consequently, the common mode noise filter improves the balance between differential signals, prevents loss of the differential signals from being degraded, and decreases a proportion in which the input differential signal component is converted into a common mode, which then is output.

The conventional common mode filter illustrated in FIG. 11 may generate common mode noise when differential signals pass through the interior of common mode filter. Specifically, a wireless communication function, such as Wi-Fi, incorporated into smartphones, personal computers, and other devices has communication frequency bandwidths of a 2.4 GHz band and a 5.0 GHz band. If each differential signal contains a frequency component of 2.4 GHz to 5.0 GHz, a part of this differential signal component is converted into a common mode noise of 2.4 GHz to 5.0 GHz. This common mode noise degrades a receiving sensitivity of the wireless communication function, such as Wi-Fi. Thus, it is necessary to minimize a proportion in which a differential signal component is converted into common mode noise. In this regard, the common mode noise filter of the present invention exerts a significant effect.

Comparison Between Line Lengths

Next, a comparative result of a case where line length varies will be described with reference to FIGS. 8 and 9.

Figure 8:
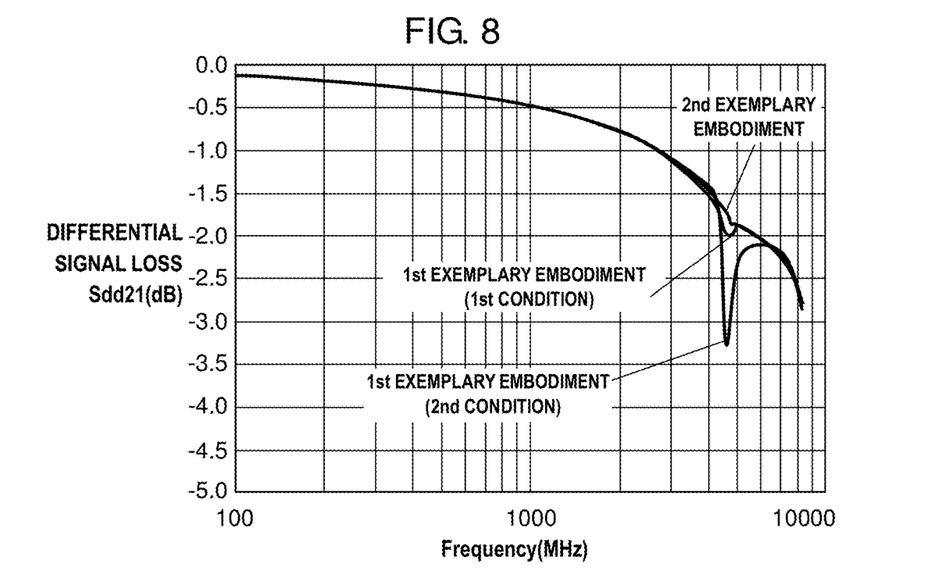
FIG. 8 is a comparative diagram illustrating differential signal losses of the common mode noise filters in the first exemplary embodiment and the second exemplary embodiment.
Figure 9:
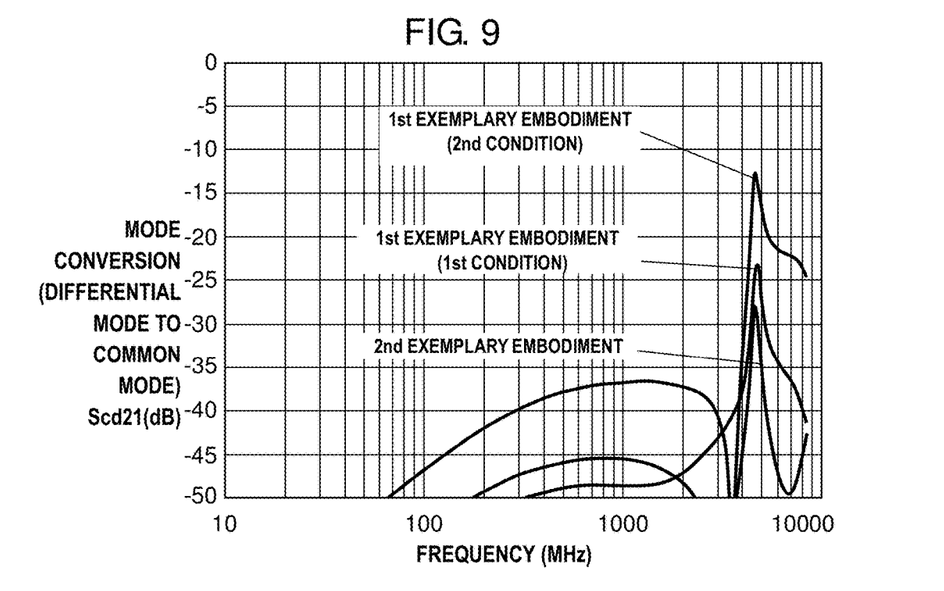
FIG. 9 is a comparative diagram illustrating a mode conversion property of the common mode noise filters in the first exemplary embodiment.

In FIGS. 8 and 9, the curve indicated by the first exemplary embodiment (first condition) is a measurement result obtained under the condition that first coil 12 and second coil 13 in the first exemplary embodiment, described with reference to FIG. 1, have the same line length. The curve indicated by the first exemplary embodiment (second condition) is a measurement result obtained under the condition that first coil 12 and second coil 13 have different line lengths. The curve indicated by the second exemplary embodiment is a measurement result obtained under the condition that first coil 12 and second coil 13 in the second exemplary embodiment, described with reference to FIG. 6, have the same line length.

FIG. 8 is a comparative diagram indicating differential signal losses measured under the above three conditions.

FIG. 9 is a comparative diagram indicating mode conversion properties from a differential mode to a common mode, which are measured under the above three conditions.

As can be seen from FIGS. 8 and 9, when the common mode noise filter in the second exemplary embodiment of the present invention is compared with the common mode noise filters in the first exemplary embodiment of the present invention in which first coil 12 and second coil 13 have different line lengths and in which first coil 12 and second coil 13 have the same line length, the common mode noise filter in the second exemplary embodiment further suppresses a differential signal loss from degrading in a high-frequency region and converts a lower proportion of a differential signal component into a common mode.

Setting the line lengths of first coil 12 and second coil 13 equal to each other is more preferable than setting the line lengths of first coil 12 and second coil 13 different from each other. Furthermore, the arrangement in which third coil conductor 16 and fourth coil conductor 17 constituting second coil 13 are disposed so as to be sandwiched between first coil conductor 14 and second coil conductor 15 constituting first coil 12, as illustrated in FIG. 6, is more preferable than the arrangement in which first coil conductor 14, second coil conductor 15, third coil conductor 16, and fourth coil conductor 17 are disposed so that first coil 12 and second coil 13 are alternately disposed, as illustrated in FIG. 1, in terms of a property of suppressing a differential signal component from being converted into a common mode.

The insulating layer 11d (third insulating layer) positioned between first common mode filter unit 18 and second common mode filter unit 19 may have a smaller thickness than other insulating layers. There are cases where insulating layer 11d is made up of a plurality of insulating layers. In this case, the plurality of insulating layers are collectively regarded as insulating layer 11d. A total thickness of the plurality of insulating layers making up insulating layer 11d is regarded as a thickness of the insulating layer positioned between first common mode filter unit 18 and second common mode filter unit 19 (a thickness of the third insulating layer).

The insulating layer 11d (third insulating layer) positioned between first common mode filter unit 18 and second common mode filter unit 19 may have a lower dielectric constant than other insulating layers.

The above configuration decreases stray capacitance between first common mode filter unit 18 and second common mode filter unit 19. Thus, the configuration can suppress the signals passing through first common mode filter unit 18 and second common mode filter unit 19 from being degraded by the stray capacitance therebetween, even when differential signals enter the common mode noise filter. This improves the balance between differential signals in first common mode filter unit 18 and second common mode filter unit 19, prevents loss of the differential signals from being degraded, and decreases a proportion in which an input differential signal component is converted into common mode noise, which then is output.

Third Exemplary Embodiment

A common mode noise filter according to a third exemplary embodiment of the present invention will be described below with reference to the drawings.

Figure 10:
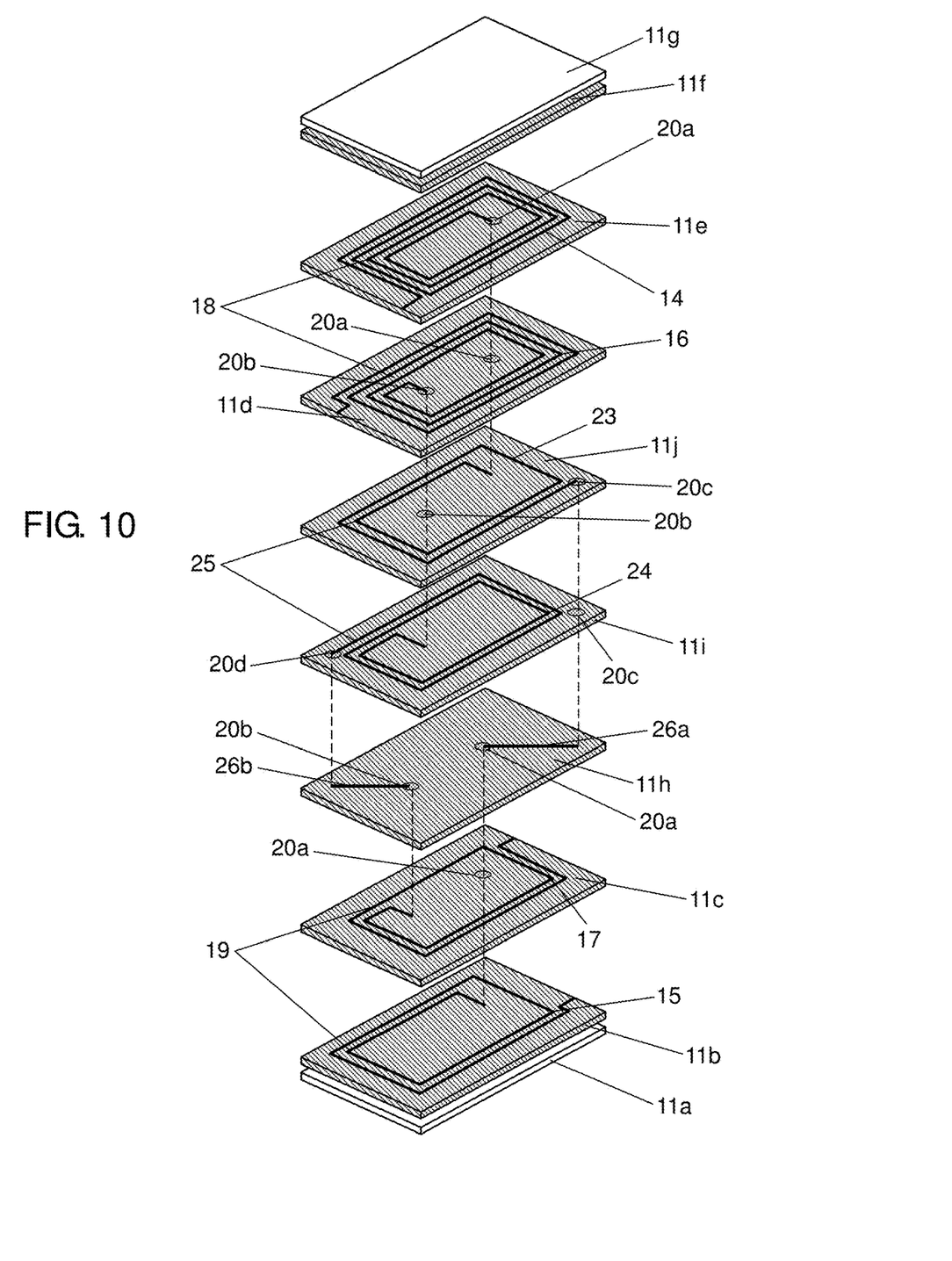
FIG. 10 is an exploded perspective view of a common mode noise filter in a third exemplary embodiment.

FIG. 10 is an exploded perspective view of the common mode noise filter in the third exemplary embodiment of the present invention. Components in the third exemplary embodiment of the present invention which are similar to those in the first and second exemplary embodiments of the present invention are given identical reference characters and will not be described.

The third exemplary embodiment is different from the second exemplary embodiment described with reference to FIG. 6, in that third common mode filter unit 25 configured by fifth coil conductor 23 and sixth coil conductor 24 is disposed between first common mode filter unit 18 and second common mode filter unit 19. First coil conductor 14 is connected to second coil conductor 15 through fifth coil conductor 23. Third coil conductor 16 is connected to fourth coil conductor 17 through sixth coil conductor 24.

The direction in which currents flow through fifth coil conductor 23 and sixth coil conductor 24 in third common mode filter unit 25 is opposite to the direction in which currents flow through first coil conductor 14 and third coil conductor 16 in first common mode filter unit 18. Fifth coil conductor 23 constitutes a portion of first coil 12 because fifth coil conductor 23 is connected to both first coil conductor 14 and second coil conductor 15. Sixth coil conductor 24 constitutes a portion of second coil 13, because sixth coil conductor 24 is connected to both third coil conductor 16 and fourth coil conductor 17.

The common mode noise filter in this exemplary embodiment includes third common mode filter unit 25 including fifth coil conductor 23 and sixth coil conductor 24. Fifth coil conductor 23 constituting first coil 12 and sixth coil conductor 24 constituting second coil 13 are disposed between first common mode filter unit 18 and second common mode filter unit 19. First coil conductor 14 is connected to second coil conductor 15 through fifth coil conductor 23. Third coil conductor 16 is connected to fourth coil conductor 17 through sixth coil conductor 24.

First coil conductor 14 is connected to second coil conductor 15 by first via electrodes 20a, fifth coil conductor 23, third via electrodes 20c positioned in the peripheries of fifth and sixth coil conductors 23, 24, and routing conductor 26a.

Third coil conductor 16 is connected to fourth coil conductor 17 by second via electrodes 20b, sixth coil conductor 24, fourth via electrode 20d positioned on the periphery of sixth coil conductor 24, and routing conductor 26b. Fifth coil conductor 23 is formed on the upper surface of insulating layer 11j. Sixth coil conductor 24 is formed on the upper surface of insulating layer 11i. Routing conductors 26a, 26b are formed on the upper surface of insulating layer 11h.

This configuration can set a total length of coil conductors constituting first coil 12 to be substantially equal to a total length of coil conductors constituting second coil 13 by adjusting lengths of fifth coil conductor 23 and sixth coil conductor 24 in third common mode filter unit 25.

In this exemplary embodiment, fifth coil conductor 23 is formed as a portion of first coil 12 (refer to FIGS. 3 and 10; fifth coil conductor 23 is not illustrated in FIG. 3). Fifth coil conductor 23 is connected to second coil conductor 15 through third via electrodes 20c. Third via electrodes 20c are provided near second external electrode 22b connected to first coil 12 having fifth coil conductor 23 as its portion.

Similar to the above, sixth coil conductor 24 is formed as a portion of second coil 13 (refer to FIGS. 3 and 10; sixth coil conductor 24 is not illustrated in FIG. 3). Sixth coil conductor 24 is connected to fourth coil conductor 17 through fourth via electrodes 20d. Fourth via electrodes 20d are provided near third external electrode 22c connected to second coil 13 having sixth coil conductor 24 as its portion.

In this exemplary embodiment, third via electrodes 20c are provided near second external electrode 22b, but alternatively may be provided near first external electrode 22a. Fourth via electrodes 20d are provided near third external electrode 22c, but alternatively may be provided near fourth external electrode 22d.

Third via electrodes 20c are formed near an external electrode having the same electric potential, and fourth via electrodes 20d are formed near an external electrode having the same electric potential. This makes it possible to ensure insulation reliability between fifth coil conductor 23 and the external electrode and between sixth coil conductor 24 and the external electrode.

In the common mode noise filter in this exemplary embodiment, the connections between fifth coil conductor 23 and first coil conductor 14 and between fifth coil conductor 23 and second coil conductor 15 are made by via electrodes 20a, 20c, respectively. The connections between sixth coil conductor 24 and third coil conductor 16 and between sixth coil conductor 24 and fourth coil conductor 17 are made by via electrodes 20b, 20d, respectively. At least portion of via electrodes 20a, 20c connected to fifth coil conductor 23 is provided near external electrode 22a or external electrode 22b to which first coil 12 is connected. At least portion of via electrodes 20b, 20d connected to sixth coil conductor 24 is provided near external electrode 22c or external electrode 22d to which second coil 13 is connected.

The above common mode noise filters in the first to third exemplary embodiments of the present invention are each provided with one first coil 12 and one second coil 13. However, each of these common mode noise filters may employ an array type in which two or more first coils 12 and two or more second coils 13 are provided.

In the above description, one first common mode filter unit 18 and one second common mode filter unit 19 are provided. However, two or more first common mode filter units 18 and two or more second common mode filter units 19 may be provided to ensure attenuations in many more frequency bandwidths.

In order to improve the magnetic coupling, a magnetic section may be formed at the center of insulating layers 11b to 11f.

INDUSTRIAL APPLICABILITY

A common mode noise filter according to the present invention can provide attenuations in two frequency bandwidths. The present invention is effective, especially for a compact, slim common mode noise filter or other device to be used as a noise reduction component in various electronic devices, including a digital device, an audiovisual device, and information communication terminal.

REFERENCE MARKS IN THE DRAWINGS 11a to 11g: insulating layer
12: first coil
13: second coil
14: first coil conductor
15: second coil conductor
16: third coil conductor
17: fourth coil conductor
18: first common mode filter unit
19: second common mode filter unit
23: fifth coil conductor
24: sixth coil conductor
25: third common mode filter unit

The invention claimed is:

1. A common mode noise filter comprising:
a plurality of insulating layers stacked on top of one another;
a first coil formed in the plurality of insulating layers, the first coil including a first coil conductor and a second coil conductor each having a spiral shape; and
a second coil formed in the plurality of insulating layers, the second coil including a third coil conductor and a fourth coil conductor each having a spiral shape,
wherein an arrangement is made in accordance with (1) or (2),
(1) the first coil conductor, the second coil conductor, the third coil conductor, and the fourth coil conductor are disposed so that the first coil and the second coil are alternately disposed, or
(2) the third coil conductor and the fourth coil conductor are disposed so as to be sandwiched between the first coil conductor and the second coil conductor,
the first coil conductor and the third coil conductor are magnetically coupled together to form a first common mode filter unit,
the second coil conductor and the fourth coil conductor are magnetically coupled together to form a second common mode filter unit,
the first common mode filter unit is connected in series to the second common mode filter unit,
a first direction is opposite to a second direction as viewed from above, the first direction being a direction in which currents flow through the first coil conductor and the third coil conductor in the first common mode filter unit, and the second direction being a direction in which currents flow through the second coil conductor and the fourth coil conductor in the second common mode filter unit,
wherein a number of turns of each of the first coil conductor and the third coil conductor in the first common mode filter unit is different from a number of turns of each of the second coil conductor and the fourth coil conductor in the second common mode filter unit, and
wherein the number of turns of each of the first coil conductor and the third coil conductor, or, the number of turns of each of the second coil conductor and the fourth coil conductor, is at least three.

2. The common mode noise filter according to claim 1, wherein
the plurality of insulating layers include a first insulating layer and a second insulating layer,
the first insulating layer is in contact with only one or both of the first coil conductor and the third coil conductor, among the first to fourth coil conductors,
the second insulating layer is in contact with only one or both of the second coil conductor and the fourth coil conductor, among the first to fourth coil conductors, and
a dielectric constant of the first insulating layer is different from a dielectric constant of the second insulating layer.

3. The common mode noise filter according to claim 1, wherein
a magnetic substance is formed on only one of upper and lower sides of the plurality of insulating layers, the side on which a coil conductor having a larger number of turns is formed.

4. The common mode noise filter according to claim 1, wherein
a total length of coil conductors that constitute the first coil is substantially equal to a total length of coil conductors that constitute the second coil.

5. The common mode noise filter according to claim 1, wherein
the plurality of insulating layers include a third insulating layer,
the third insulating layer is positioned between the first common mode filter unit and the second common mode filter unit, and
a thickness of the third insulating layer is larger than any of thicknesses of other insulating layers of the plurality of insulating layers.

6. The common mode noise filter according to claim 1, wherein
the plurality of insulating layers include a third insulating layer,
the third insulating layer is positioned between the first common mode filter unit and the second common mode filter unit, and
a dielectric constant of the third insulating layer is lower than any of dielectric constants of other insulating layers of the plurality of insulating layers.

7. The common mode noise filter according to claim 1, further comprising a third common mode noise filter unit that includes a fifth coil conductor and a sixth coil conductor,
wherein the fifth coil conductor that forms the first coil and the sixth coil conductor that forms the second coil are disposed between the first common mode filter unit and the second common mode filter unit, the first coil conductor is connected to the second coil conductor through the fifth coil conductor, and the third coil conductor is connected to the fourth coil conductor through the sixth coil conductor.

8. The common mode noise filter according to claim 7, wherein the connection between the fifth coil conductor and the first coil conductor and the connection between the fifth coil conductor and the second coil conductor are made by respective via electrodes, the connection between the sixth coil conductor and the third coil conductor and the connection between the sixth coil conductor and the fourth coil conductor are made by respective via electrodes, at least a portion of the via electrode connected to the fifth coil conductor is provided near an external electrode to which the first coil is connected, and at least a portion of the via electrode connected to the sixth coil conductor is provided near an external electrode to which the second coil is connected.

\* \* \* \* \*